(12) United States Patent
Lai et al.

(10) Patent No.: US 11,799,435 B2
(45) Date of Patent: Oct. 24, 2023

(54) AUDIO PROCESSING APPARATUS AND METHOD FOR AUDIO PROCESSING

(71) Applicant: Realtek Semiconductor Corporation, Hsinchu (TW)

(72) Inventors: Chun Hao Lai, Hsinchu (TW); Tsung-Peng Chuang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 17/646,286

(22) Filed: Dec. 28, 2021

(65) Prior Publication Data

US 2023/0054499 A1 Feb. 23, 2023

(30) Foreign Application Priority Data

Aug. 23, 2021 (TW) ................................. 110131083

(51) Int. Cl.
*H03G 7/00* (2006.01)
*H04R 5/04* (2006.01)
*H04R 29/00* (2006.01)

(52) U.S. Cl.
CPC .............. *H03G 7/005* (2013.01); *H04R 5/04* (2013.01); *H04R 29/001* (2013.01); *H04R 2430/01* (2013.01)

(58) Field of Classification Search
None
See application file for complete search history.

(56) References Cited

U.S. PATENT DOCUMENTS

| | | | | |
|---|---|---|---|---|
| 8,126,164 B2* | 2/2012 | Bjorn-Josefsen | .... | H03G 3/3089 381/109 |
| 9,065,413 B2* | 6/2015 | Pereira | ................. | H03G 3/3005 |
| 9,461,604 B2* | 10/2016 | Matsumura | ............. | H03G 3/20 |
| 9,620,131 B2* | 4/2017 | Patel | ..................... | G10L 19/005 |
| 9,859,858 B2* | 1/2018 | Porter | ..................... | H03G 7/002 |
| 10,785,568 B2* | 9/2020 | Das | ........................ | H03M 1/70 |
| 2002/0076063 A1 | 6/2002 | Caldwell | | |
| 2009/0274321 A1* | 11/2009 | Doppel | ................ | H03G 1/0088 381/104 |
| 2010/0244951 A1 | 9/2010 | Smith | | |

* cited by examiner

*Primary Examiner* — Paul W Huber
(74) *Attorney, Agent, or Firm* — CKC & Partners Co., LLC (57) ABSTRACT

An audio processing device includes a signal processing circuit, a power switch circuit, a power amplifier and a detection circuit. The signal processing circuit is configured to process an audio input to generate an audio signal. The power switch circuit is configured to generate an operating voltage. The power amplifier is coupled with the signal processing circuit and the power switch circuit, and configured to drive a load circuit by the operating voltage according to the audio signal. The detection circuit is coupled with the signal processing circuit and the power switch circuit, configured to obtain a volume value from the audio signal and compare the volume value with a first volume threshold to generate a comparison result, and configured to control, according to the comparison result, the power switch circuit to set the operating voltage to have a corresponding one of multiple voltage levels.

17 Claims, 5 Drawing Sheets

AUDIO PROCESSING APPARATUS AND METHOD FOR AUDIO PROCESSING

RELATED APPLICATION

This application claims priority to Taiwan Application Serial Number 110131083, filed on Aug. 23, 2021, which is herein incorporated by reference in its entirety.

BACKGROUND

Technical Field

The present disclosure relates to an audio processing device and a method of the audio processing. More particularly, the present disclosure relates to an audio processing device and a method of audio processing capable of adaptively adjusting power consumption.

Description of Related Art

Laptops, smart phones, tablet or other portable electronic devices are generally equipped with speakers and audio power amplifier circuits that drive the speakers. The operating voltage of the audio power amplifier circuit is usually designed to have the highest voltage level as possible, so that the volume range of the portable electronic device can cover both the ordinary volume required for personal use and the large volume required for multiple people to have fun. However, in most usage scenarios, the audio effects of the portable electronic device is only played for a single user and so that maintaining the operating voltage at a high voltage level will cause unnecessary consumption to the limited power of the portable electronic device.

SUMMARY

The disclosure provides an audio processing device, which includes a signal processing circuit, a power switch circuit, a power amplifier and a detection circuit. The signal processing circuit is configured to process an audio input to generate an audio signal. The power switch circuit is configured to generate an operating voltage. The power amplifier is coupled with the signal processing circuit and the power switch circuit, configured to drive a load circuit by the operating voltage according to the audio signal. The detection circuit is coupled with the signal processing circuit and the power switch circuit, configured to obtain a volume value from the audio signal and compare the volume value with a first volume threshold to generate a comparison result, and configured to control, according to the comparison result, the power switch circuit to set the operating voltage to have a corresponding one of a plurality of voltage levels.

The disclosure provides a method of processing audio which includes processing an audio input by a signal processing circuit to generate an audio signal; receiving an operating voltage; obtaining a volume value by the audio signal; comparing the volume value with a first volume threshold to generating a comparison result; setting, in response to the comparison result, the operating voltage to have a corresponding one of a plurality of voltage levels; and driving a load circuit by a power amplifier according to the audio signal.

The disclosure provides an audio processing device which includes a signal processing circuit, a power amplifier and a detection circuit. The signal processing circuit is configured to process an audio input to generate an audio signal. The power amplifier includes a modulator and a plurality of output stage circuits. The modulator is coupled with the signal processing circuit, and configured to generate a PWM signal and also configured to determine a duty cycle of the PWM signal according to the audio signal. The plurality of output stage circuits is coupled with the modulator and the detection circuit, configured to receive a plurality of operating voltage, respectively, and also configured to receive the PWM signal, in which the plurality of operating voltages have respective voltage levels different from each other. The detection circuit is coupled with the signal processing circuit and the power switch circuit, configured to obtain a volume value from the audio signal, configured to compare the volume value with a first volume threshold to generate a comparison result, and configured to enable, according to comparison result, a corresponding one of the plurality of output stage circuits to drive a load circuit.

One of the advantages of the above audio processing device and method of audio processing is that the power consumption can adjusts the power consumption thereof adaptively.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
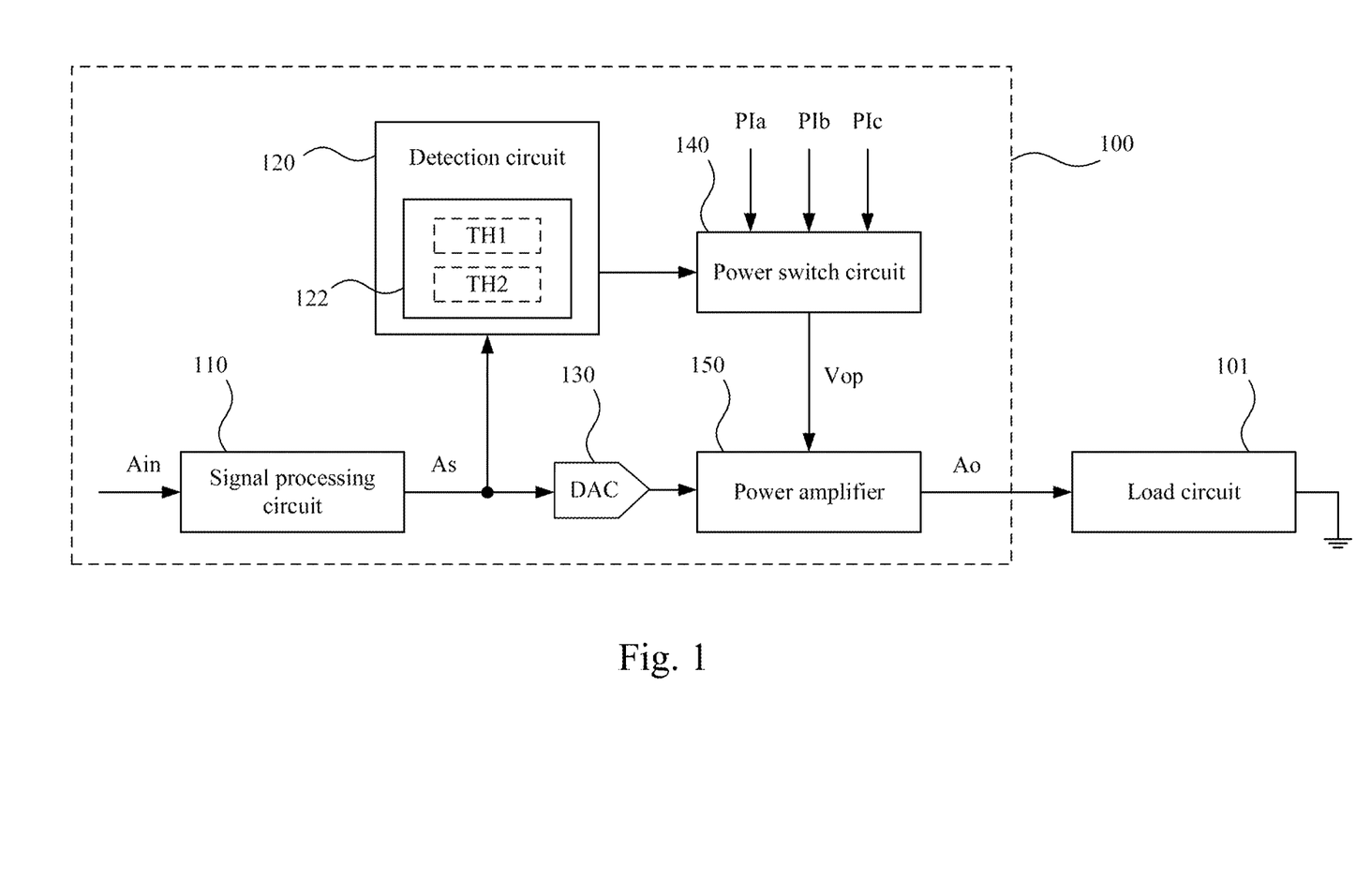
FIG. 1 is a simplified functional block diagram of an audio processing device according to one embodiment of the present disclosure.

FIG. 1 is a simplified functional block diagram of an audio processing device 100 according to one embodiment of the present disclosure. The audio processing device 100 includes a signal processing circuit 110, a detection circuit 120, a digital-to-analog converter (DAC) 130, a power switch circuit 140, and a power amplifier 150. The audio processing device 100 is configured to amplify an audio input Ain to generate an audio output Ao configured to drive a load circuit 101. The audio processing device 100 is also configured to adjust multiple properties of the audio input to control the quality and output volume of the load circuit 101. For the sake of brevity, other components and connection relationships of the audio processing device 100 are not shown in FIG. 1. In some embodiments, the audio processing device 100 may be part of the circuit of a sound chip or sound card. In other embodiments, the load circuit 101 can be an electronic device that can play audio, such as a desktop computer speaker, built-in speakers of the display or a headset.

The signal processing circuit 110 is configured to receive and process the audio input Ain to generate an audio signal As. In this embodiment, the audio input Ain and the audio signal As are digital signals, and each of the audio input Ain and the audio signal As transmits the digitized volume values by packet. The volume values of the audio input Ain correspond to amplitudes of an original analog audio source. For example, the audio input Ain can be an online audio streaming and the volume values of the audio input Ain are sampled from an original analog waveform of the song being streamed. The volume values of the audio signal As can be configured to specify a duty ratio of the analog audio output Ao outputted by the power amplifier 150, that is, to specify the output volume of the load circuit 101. The process that the signal processing circuit 110 conducts to the audio input Ain can be attenuating the volume of the audio signal Ain to control the output volume of the load circuit 101, or can be adjusting magnitude of one or more frequency components in the audio input Ain to adjust the output quality or style of the load circuit 101.

Figure 2:
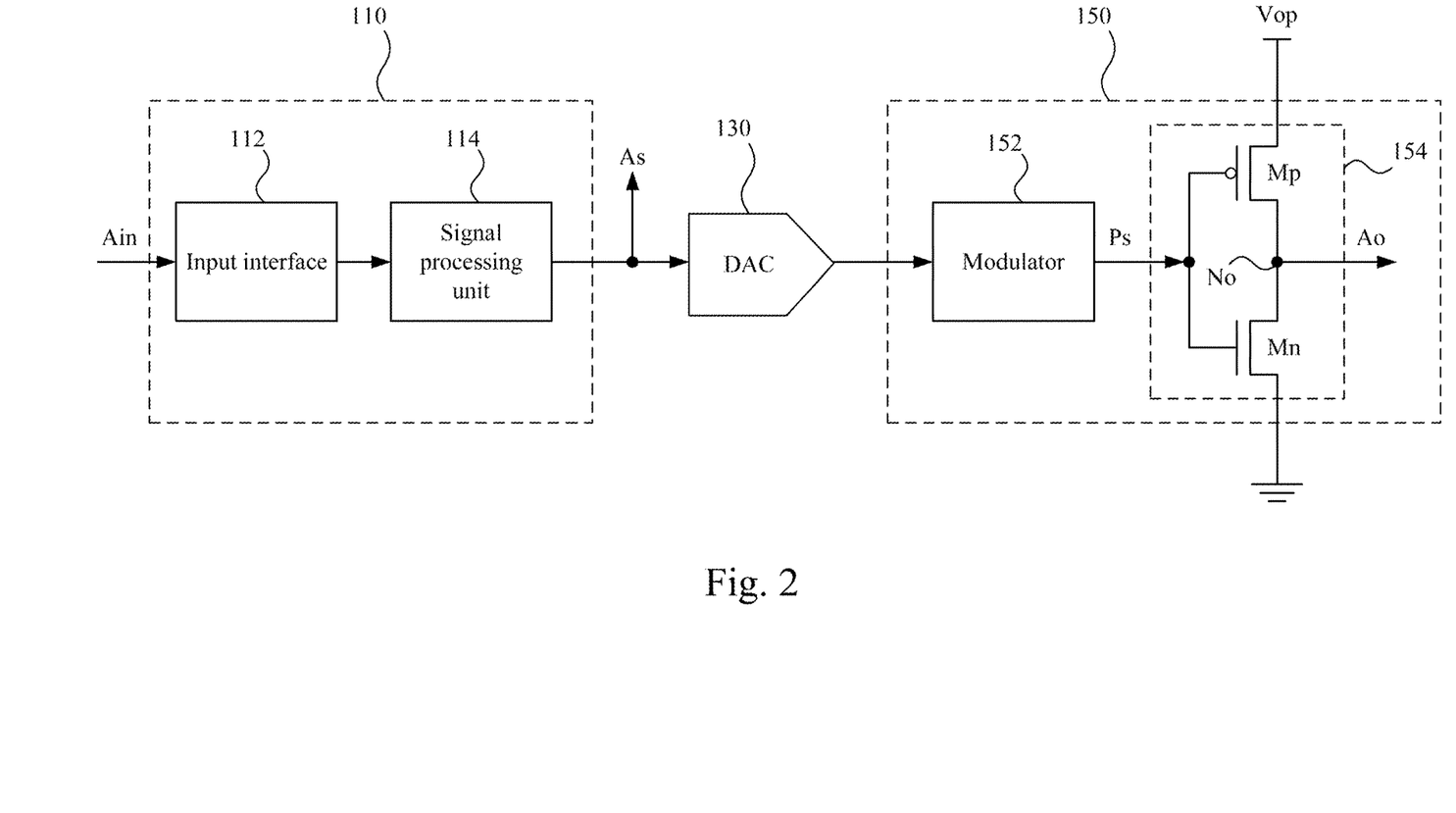
FIG. 2 is a simplified functional block diagram of a signal processing circuit and a power amplifier in FIG. 1.

FIG. 2 is a simplified functional block diagram of the signal processing circuit 110 and the power amplifier 150 in FIG. 1. Reference is made to FIG. 1 and FIG. 2. the signal processing circuit 110 includes an input interface 112 and a signal processing unit 114 coupled with each other. In this embodiment, input interface 112 is a digital input interface, such as an inter-IC sound (I2S) interface, a pulse density modulation (PDM) interface or a time-division multiplexing (TDM) interface, but the present disclosure is not limited thereto. In some embodiments, the input interface 112 is an analog input interface to receive the audio input Ain in the analog form, more detailed explanations are given in subsequent paragraphs. To generate the audio signal As, the signal processing unit 114 is configured to selectively attenuate the volume values in the packets of the audio input Ain, and/or adjust the magnitude of one or more frequency components in the audio input Ain. For example, in the situation that the audio processing device 100 of FIG. 1 is applied to a laptop (not shown), when a user drags the volume adjustment slider displayed on the laptop or pushes the physical volume key to reach the 100% volume (i.e., the relative maximum volume), the signal processing unit 114 can apply a 0 dB decrement to the volume value of the audio input Ain (i.e., not attenuate); and when the user switches the laptop to have the 70% volume, the signal processing unit 114 can apply a −3 dB decrement to the volume value of the audio input Ain. As another example, when the user operates an equalizer software on the laptop, the signal processing unit 114 can correspondingly adjust the magnitude of some of frequency components in the audio input Ain. Therefore, the signal processing unit 114 can be realized by software, hardware or combinations thereof.

Reference is made again to FIG. 1. The signal processing circuit 110 outputs the audio signal As to the detection circuit 120 and the DAC 130. The detection circuit 120 is coupled with the signal processing circuit 110 and the power switch circuit 140, and includes a memory 122 which can, but is not limited to, be implemented as a register, in which the memory 122 stores a first volume threshold TH1 and a second volume threshold TH2. However, it should be appreciated that, in some embodiments, the first volume threshold TH1 and the second volume threshold TH2 are not limited to be stored in the memory 122, these volume thresholds can be stored in other devices or circuits different from the detection circuit 120 to be accessed by the detection circuit 120, and the first volume threshold TH1 and the second volume threshold TH2 are adjustable. The detection circuit 120 is configured to obtain a volume value from the audio signal As (e.g., by analyzing the packet of the audio signal As), and compare the volume value of the audio signal As with the first volume threshold TH1 and the second volume threshold TH2, respectively, to generate a comparison result. The detection circuit 120 is also configured to control the output of the power switch circuit 140 according to the comparison result. On the other hand, the DAC 130 is configured to transform the audio signal As to an analog signal and output to the power amplifier 150. For example, the DAC 130 generates and outputs a signal of sinusoidal wave having a corresponding amplitude according to the volume value of the audio signal As, but the present disclosure is not limited thereto.

In some embodiments, the audio input Ain and the audio signal As are analog signals. The input interface 112 of FIG. 2 can be an analog input interface, and the signal processing unit 114 of FIG. 2 can adjust the waveform and the amplitude of the audio input Ain to generate the audio signal As. The audio signal As is free from passing the DAC 130 (i.e., by omitting the DAC 130 or by bypassing) for being inputted to the power amplifier 150 in FIG. 1. The detection circuit 120 can sample the amplitudes of the audio signal As to obtain digitalized values as the volume values of the audio signal As, which is for further comparison with the first volume threshold TH1 and the second volume threshold TH2. It is worth noting that the descriptions of the memory 122 of FIG. 1 storing two volume thresholds are only for explanation convenience. In some embodiments, the memory 122 can store one or more volume thresholds configured to be compared with the volume value of the audio signal As.

Reference is made again to FIG. 1. The power switch circuit 140 is coupled with the detection circuit 120 and power amplifier 150, and the power switch circuit 140 is configured to receive a first power signal Pla, a second power signal Plb and a third power signal Plc, in which the first power signal Pla, the second power signal Plb and the third power signal Plc have different voltage levels. The power switch circuit 140 is also configured to output an operating voltage Vop to the power amplifier 150, in which the power switch circuit 140 selects one of the first power signal Pla, the second power signal Plb and the third power signal Plc to output as the operating voltage Vop according to the control of the detection circuit 120. It is worth noting that the descriptions of the power switch circuit 140 receiving three power signals are only for explanation convenience. In some embodiments, the power switch circuit 140 can receive more than two power signals having different voltage levels. When the power switch circuit 140 receives more power signals, the memory 122 can correspondingly store more volume thresholds to increase the flexibility of the detection circuit 120 of controlling the power switch circuit 140 according to the audio signal As.

The power amplifier 150 is coupled with the output terminal of the DAC 130, and is configured to generate the audio output Ao to drive the load circuit 101, in which a maximum output power of the power amplifier 150 can be determined by the voltage level of the operating voltage Vop. In some embodiments, the power amplifier 150 is a class-D power amplifier. As shown in FIG. 2, the power amplifier 150 includes a modulator 152 and an output stage circuit 154. The modulator 152 is configured to receive an analog audio signal, which is transformed from the audio signal As by the DAC 130 and has the sinusoidal waveform, and configured to transform the analog audio signal to a pulse-width modulation (PWM) signal Ps. The modulator 152 is further configured to output the PWM signal Ps to the output stage circuit 154, in which the duty ratio of the PWM signal Ps is positively correlated with (i.e., directly proportional to) the amplitude of the analog audio signal As in the positive half cycle, and the duty ratio of the PWM signal Ps is negatively correlated with (i.e., inversely proportional to) the amplitude of the analog audio signal As in the negative half cycle.

The output stage circuit 154 is configured to receive the PWM signal Ps and the operating voltage Vop, and includes a first transistor Mp, a second transistor Mn and an output node No. The output stage circuit 154 amplifies the PWM signal Ps by using the operating voltage Vop, so as to drive the load circuit 101. In detail, the output stage circuit 154 provides the PWM signal Ps to gates of the first transistor Mp and the second transistor Mn. The first transistor Mp is configured to receive the operating voltage Vop, and the first transistor Mp and the second transistor Mo form an amplifier using the output node No as an output terminal. The output node No is configured to generate the audio output Ao, that is, the audio output Ao is generated by amplifying the PWM signal Ps. For explanation convenience, FIG. 2 depicts the simplified output stage circuit 154, but the present disclosure is not limited thereto. In some embodiments, in order to increase the output power, the output stage circuit 154 can include two amplifiers configured to generate a differential output, and output terminals of these two amplifiers are coupled with two ends of the load circuit 101, respectively, to form a bridge-tied load.

Figure 3:
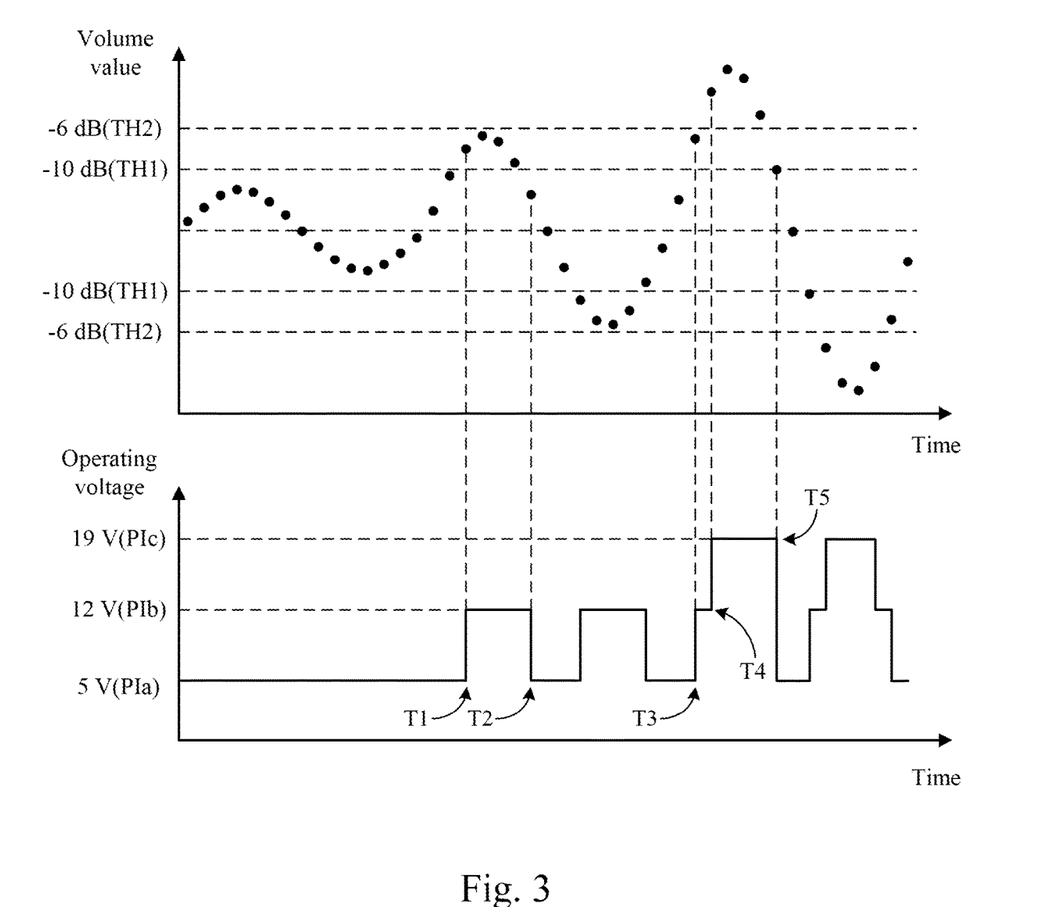
FIG. 3 depicts a schematic diagram of a distribution on a time axis of multiple volume values of an audio signal according to one embodiment of the present disclosure.

The operation that the detection circuit 120 controls the power switch circuit 140 is described in the following paragraphs with reference to FIG. 1 together with FIG. 3 through FIG. 4. Reference is made to FIG. 1 and FIG. 3 first. FIG. 3 depicts a schematic diagram of a distribution of the volume values of the audio signal As at multiple time points on a time axis, according to one embodiment of the present disclosure. In the embodiment of FIG. 3, the first volume threshold TH1 and the second volume threshold TH2 can be, but not limited to, −10 dB and −6 dB, respectively, and the first power signal Pla, the second power signal Plb and the third power signal Plc can be, but not limited to, 5 V, 12 V and 19 V. The detection circuit 120 compares each volume value of the audio signal As with the first volume threshold TH1 and the second volume threshold TH2. For example, before a first time point T1, the detection circuit 120 determines that the volume value of the audio signal As is less than the first volume threshold TH1, and therefore the detection circuit 120 controls the power switch circuit 140 to output the first power signal Pla as the operating voltage Vop.

At the first time point T1, the detection circuit 120 determines that the volume value of the audio signal As is greater than the first volume threshold TH1 and is less than the second volume threshold TH2, and therefore the detection circuit 120 controls the power switch circuit 140 to output the second power signal Plb as the operating voltage Vop. At the second time point T2, the detection circuit 120 determines that the volume value of the audio signal As is less than the first volume threshold TH1 again, and therefore the detection circuit 120 controls the power switch circuit 140 to output the first power signal Pla as the operating voltage Vop again.

Similarly, at the third time point T3, the detection circuit 120 determines that the volume value of the audio signal As is greater than the first volume threshold TH1 and is less than the second volume threshold TH2, and therefore the detection circuit 120 controls the power switch circuit 140 to output the second power signal Plb as the operating voltage Vop. At the fourth time point T4, the detection circuit 120 determines that the volume value of the audio signal As is greater than the first volume threshold TH1 and is greater than the second volume threshold TH2, and therefore the detection circuit 120 controls the power switch circuit 140 to output the third power signal Plc as the operating voltage Vop. Then, at the fifth time point T5, the detection circuit 120 determines that the volume value of the audio signal As is equal to the first volume threshold TH1, and therefore the detection circuit 120 controls the power switch circuit 140 to output the first power signal Pla as the operating voltage Vop. Various operations correspond to sections of upward amplitude, which are performed by the detection circuit 120 and the power switch circuit 140 in the periods between the first time point T1 and the second time point T2 and between the third time point T3 and the fifth time point T5, are also applicable to sections of downward amplitude. For the sake of brevity, those descriptions are omitted.

In summary, when the volume value of the audio signal As is less than or equal to the first volume threshold TH1, the detection circuit 120 controls the power switch circuit 140 to output the first power signal Pla as the operating voltage Vop. When the volume value of the audio signal As is greater than the first volume threshold TH1 and is less than the second volume threshold TH2, the detection circuit 120 controls the power switch circuit 140 to output the second power signal Plb as the operating voltage Vop. When the volume value of the audio signal As is greater than the first volume threshold TH1 and is greater than the second volume threshold TH2, the detection circuit 120 controls the power switch circuit 140 to output the third power signal Plc as the operating voltage Vop. In other words, whenever the detection circuit 120 detects that the volume value of the audio signal As changes from less than to greater than or from greater than to less than a certain volume threshold, the detection circuit 120 controls the power switch circuit 140 to increase or decrease the voltage level by one step.

As noted above, the audio processing device 100 of FIG. 1 can adjust the power consumption thereof adaptively according to a usage scenario. For example, if the signal processing circuit 110 outputs the audio signal As with a larger volume value based on a command given by the user to adjust the volume to 100%, the power switch circuit 140 outputs the operating voltage Vop with the highest voltage level to ensure that the power amplifier 150 has sufficient drive capability. As another example, if the signal processing circuit 110 outputs the audio signal As with a lower volume because of receiving a command to adjust the volume to 30%, the power switch circuit 140 outputs the operating voltage Vop with a lower voltage level to reduce the power consumption of the audio processing device 100.

Figure 4:
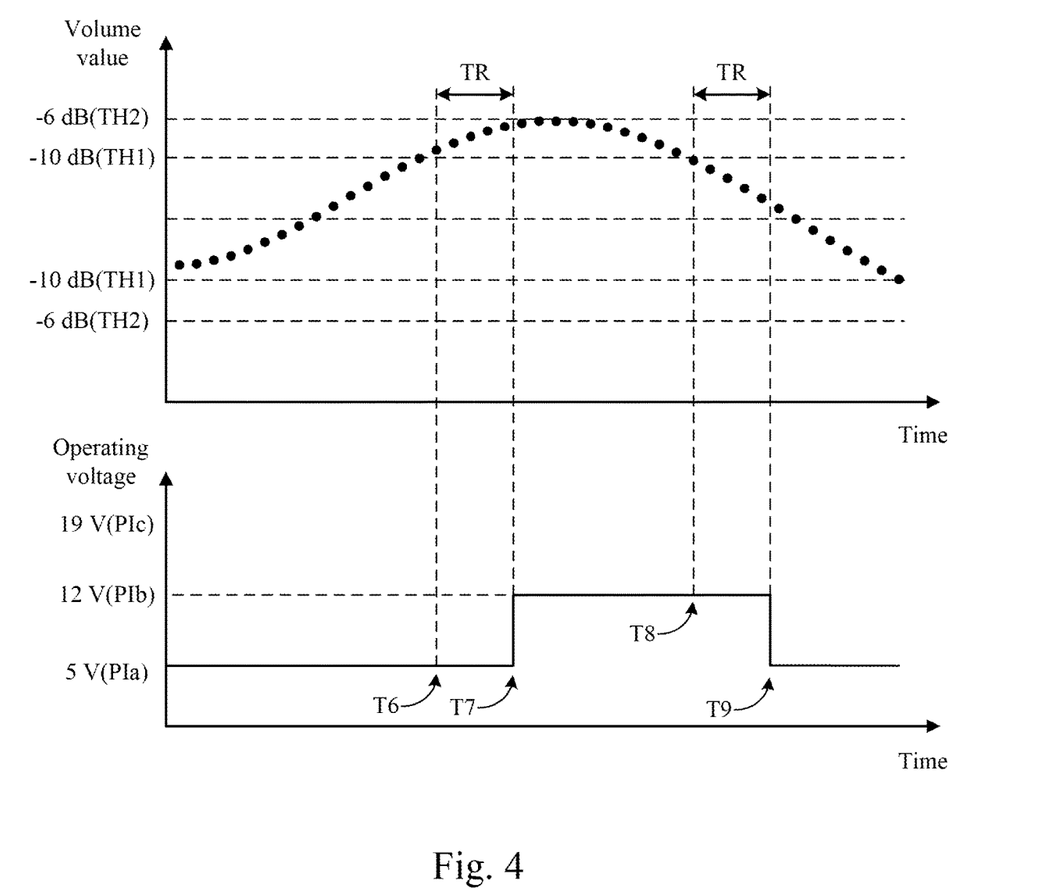
FIG. 4 depicts a schematic diagram of a distribution on the time axis of the multiple volume values of the audio signal according to another embodiment of the present disclosure.

Reference is made to FIG. 1 and FIG. 4. FIG. 4 depicts a schematic diagram of the distribution of multiple volume values of the audio signal As on the time axis, according to another embodiment of the present disclosure. The audio processing device 100 has similar operations and advantages in the two embodiments of FIG. 3 and FIG. 4, and therefore only the differences are explained in detail in the following paragraphs. In the embodiment of FIG. 4, when the detection circuit 120 determines that the volume value of the audio signal As changes from less than to greater than or from greater than to less than the first volume threshold TH1 or the second volume threshold TH2, the detection circuit 120 does not immediately control the power switch circuit 140 to change the voltage level of the operating voltage Vop. For example, when the detection circuit 120 detects that the volume value of the audio signal As is larger than the first volume threshold TH1 at the sixth time point T6, the detection circuit 120 controls the power switch circuit 140 to maintain the first power signal Pla as the operating voltage Vop. Until the detection circuit 120 receives, at the seventh time point T7, multiple continuous volume values greater than the first volume threshold TH1 and with a total number larger than a quantity threshold (e.g., 5, but not limited thereto), the detection circuit 120 controls the power switch circuit 140 to output the second power signal Plb as the operating voltage Vop instead. In some embodiments, the quantity threshold can be stored in the memory 122 of FIG. 1 in advance.

Similarly, from the eighth time point T8 to the ninth time point T9, until the detection circuit 120 receives multiple continuous volume values less than the first volume threshold TH1 and with the total number larger than the quantity threshold (e.g., 5, but not limited thereto), the detection circuit 120 controls the power switch circuit 140 to switch from outputting the second power signal Plb to outputting the first power signal Pla as the operating voltage Vop. Because the volume values of the audio signal As can be regarded as a result of sampling an analog signal under a specific frequency, the aforementioned receiving the multiple continuous volume values larger than or less than the first volume threshold TH1 can be understood as the volume value of the audio signal As remaining larger than or less than the first volume threshold TH1 for a preset time length TR (e.g., 1 second). For the sake of brevity, the embodiment of FIG. 4 only uses the first volume threshold TH1 for illustration. However, operations and judgment rules using the quantity threshold similar to those described in the embodiment of FIG. 4 can also be applied to embodiments that the audio signal As has a larger volume value and the second volume threshold TH2 or other greater volume thresholds need to be further considered, and those descriptions are omitted for the sake of brevity.

As noted above, the audio processing device 100 of FIG. 1 will not switch the voltage level of the operating voltage Vop with an excessive frequency when playing audio content with drastically changing in volume. Therefore, the amount of operation of the overall circuit is reduced, which leads to an advantage of long life cycle.

Figure 5:
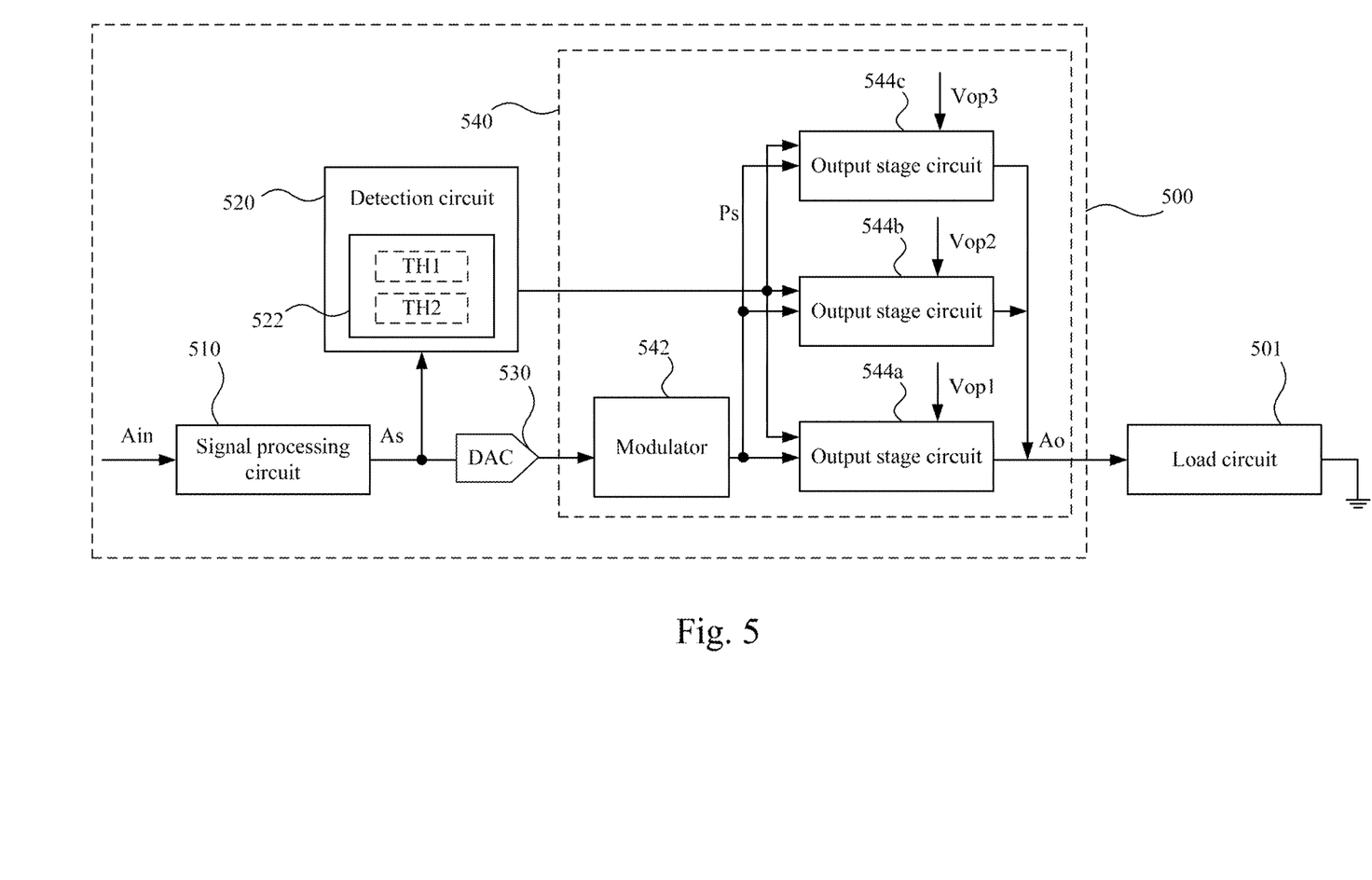
FIG. 5 is a simplified functional block diagram of an audio processing device according to one embodiment of the present disclosure.

FIG. 5 is a simplified functional block diagram of an audio processing device 500 according to one embodiment of the present disclosure. The audio processing device 500 includes a signal processing circuit 510, a detection circuit 520, a DAC 530 and a power amplifier 540. For the sake of brevity, other components and connection relationships of the audio processing device 500 are not depicted in FIG. 5. The signal processing circuit 510 and the DAC 530 in FIG. 5 are similar to the signal processing circuit 110 and the DAC 130 in FIG. 1, respectively. For the sake of brevity, those descriptions are omitted.

The detection circuit 520 is coupled with the signal processing circuit 510 and the power amplifier 540, and includes a memory 522 which can, but is not limited to, be implemented as the register, in which the memory 522 stores a first volume threshold TH1 and a second volume threshold TH2. The detection circuit 520 is configured to compare the volume values of the audio signal As with the first volume threshold TH1 and the second volume threshold TH2 to generate a comparison result. The detection circuit 520 is also configured to control the power consumption of the power amplifier 540 according to the comparison result, and more detailed explanations are in the following paragraphs.

The power amplifier 540 includes a modulator 542, an output stage circuit 544a, an output stage circuit 544b and an output stage circuit 544c. The modulator 542 is configured to receive an analog audio signal, which is transformed from the audio signal As by the DAC 530 and has the sinusoidal waveform, and configured to transform the analog audio signal to a PWM signal Ps. The modulator 152 is further configured to output the PWM signal Ps to the output stage circuit 554a, the output stage circuit 554b and the output stage circuit 554c. The output stage circuit 554a, the output stage circuit 554b and the output stage circuit 554c are configured to receive an operating voltage Vop1, an operating voltage Vop2 and an operating voltage Vop3, respectively (i.e., different values of the operating voltage Vop generated by the power switch circuit 140 in FIG. 1 according to the first power signal Pla, the second power signal Plb and the third power signal Plc), in which the voltage level of the operating voltage Vop3 is the highest, the voltage level of the operating voltage Vop2 is the second highest and the voltage level of the operating voltage Vop1 is the lowest. The output stage circuit 544a, the output stage circuit 544b and the output stage circuit 544c amplify the PWM signal Ps by using the operating voltage Vop1, the operating voltage Vop2 and the operating voltage Vop3, respectively, and one of the outputs of the output stage circuit 544a, the output stage circuit 544b and the output stage circuit 544c is used as the audio output Ao to drive the load circuit 501. Components and the connect relationships of each of the output stage circuit 544a, the output stage circuit 544b and the output stage circuit 544c are similar to that of the output stage circuit 154 of FIG. 2. For the sake of brevity, those descriptions are omitted. It is worth noting that the power amplifier 540 is described as including three output stage circuits only for the convenience of illustration. In some embodiments, the power amplifier 540 can include more than two the output stage circuits receiving different voltages. When the power amplifier 540 includes more output stage circuits, the memory 522 can correspondingly store more volume thresholds, so as to increase the flexibility of the detection circuit 520 to control the power amplifier 540 according to the audio signal As.

In some embodiments, when the detection circuit 520 determines that the volume value of the audio signal As is less than or equal to the first volume threshold TH1, the detection circuit 520 enables the output stage circuit 544a, and disables the output stage circuit 544b and the output stage circuit 544c. When the detection circuit 520 determines that the volume value of the audio signal As is greater than the first volume threshold TH1 and less than or equal to the second volume threshold TH2, the detection circuit 520 enables the output stage circuit 544b and disables the output stage circuits 544a and the output stage circuit 544c. When the detection circuit 520 determines that the volume value of the audio signal As is greater than the first volume threshold TH1 and greater than the second volume threshold TH2, the detection circuit 520 enables the output stage circuit 544c, and disables the output stage circuit 544a and output stage circuit 544b. In other words, this embodiment is substantially the same as the embodiment of FIG. 3, the difference is that the detection circuit 120 in FIG. 1 controls the power switch circuit 140 based on the audio signal As, and the detection circuit 520 in FIG. 5 is based on the audio signal As to enable a corresponding one of the multiple output stage circuits.

In another embodiment, when the detection circuit 520 determines that the volume value of the audio signal As changes from less than to greater than or from greater than to less than the first volume threshold TH1 or the second volume threshold TH2, the detection circuit 520 does not immediately change the enabled output stage circuit. For example, when the volume value of the audio signal As changes from less than to greater than the first volume threshold TH1, the detection circuit 520 keeps enabling the output stage circuit 544*a*, and until the detection circuit 520 receives multiple continuous volume values greater than the first volume threshold TH1 with a total number greater than a quantity threshold (e.g., 5, but not limited thereto), the detection circuit 520 changes to enable the output stage circuit 544*b*. As another example, when the volume value of the audio signal As changes from greater than to less than the first volume threshold TH1, the detection circuit 520 keeps enabling the output stage circuit 544*b*, and until the detection circuit 520 receives multiple continuous volume values greater than the first volume threshold TH1 with the total number greater than a quantity threshold (e.g., 5, but not limited thereto), the detection circuit 520 changes to enable the output stage circuit 544*a*. In other words, this embodiment is similar to the embodiment of FIG. 4, and the difference is that the detection circuit 120 in FIG. 1 controls the power switch circuit 140 based on the audio signal As, but the detection circuit 520 in FIG. 5 enables a corresponding one of the multiple output stage circuits according to the audio signal As.

In some embodiments, the detection circuit 120 and/or the power switch circuit 140 in FIG. 1 can be disposed outside the chip package of the audio processing device 100. In another embodiment, the detection circuit 520 in FIG. 5 can be disposed outside the chip package of the audio processing device 500. Various circuit settings that can select the operating voltage for power amplification based on the volume values in the audio data packets are all within the contemplation of this disclosure.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. An audio processing device, comprising:
   a signal processing circuit, configured to process an audio input to generate an audio signal, wherein the signal processing circuit generates the audio signal by selectively attenuating the audio input or by adjusting magnitude of one or more frequency components in the audio input;
   a power switch circuit, configured to generate an operating voltage;
   a power amplifier, coupled with the signal processing circuit and the power switch circuit, configured to drive a load circuit by the operating voltage according to the audio signal; and
   a detection circuit, coupled with the signal processing circuit and the power switch circuit, configured to obtain a volume value from the audio signal and compare the volume value with a first volume threshold to generate a comparison result, and configured to control, according to the comparison result, the power switch circuit to set the operating voltage to have a corresponding one of a plurality of voltage levels.

2. The audio processing device of claim 1, wherein
   in response to the volume value less than or equal to the first volume threshold, the detection circuit controls the power switch circuit to set the operating voltage to have a first voltage level,
   in response to the volume value greater than the first volume threshold, the detection circuit controls the power switch circuit to set the operating voltage to have a second voltage level greater than the first voltage level.

3. The audio processing device of claim 2, wherein
   in response to the volume value less than or equal to a second volume threshold and greater than the first volume threshold, the detection circuit controls the power switch circuit to set the operating voltage to have the second voltage level,
   in response to the volume value greater than the second volume threshold, the detection circuit controls the power switch circuit to set the operating voltage to have a third voltage level greater than the second voltage level.

4. The audio processing device of claim 2, wherein the audio signal has a plurality of volume values comprising the volume value,
   if the plurality of volume values comprise continuous ones greater than the first volume threshold, and a number of the continuous ones is greater than a quantity threshold, the detection circuit controls the power switch circuit to set the operating voltage to have the second voltage level,
   if the plurality of volume values comprise the continuous ones greater than the first volume threshold, and the number of the continuous ones is less than or equal to the quantity threshold, the detection circuit controls the power switch circuit to maintain the operating voltage at the first voltage level.

5. The audio processing device of claim 1, wherein the power amplifier comprises:
   a modulator, configured to generate a pulse-width modulation (PWM) signal, wherein the modulator determines a duty cycle of the PWM signal according to the audio signal; and
   an output stage, configured to receive the operating voltage and the PWM signal, and also configured to amplify the PWM signal by the operating voltage to drive the load circuit.

6. The audio processing device of claim 1, wherein the power amplifier is a class-D power amplifier.

7. A method of processing audio, comprising:
processing an audio input by a signal processing circuit to generate an audio signal, wherein processing the audio input by the signal processing circuit to generate the audio signal comprises selectively attenuating the audio input or by adjusting magnitude of one or more frequency components in the audio input;
receiving an operating voltage;
obtaining a volume value from the audio signal;
comparing the volume value with a first volume threshold to generating a comparison result;
in response to the comparison result, setting the operating voltage to have a corresponding one of a plurality of voltage levels; and
driving a load circuit by a power amplifier according to the audio signal.

8. The method of claim 7, wherein setting the operating voltage to have the corresponding one of the plurality of voltage levels comprises:
in response to the volume value less than or equal to the first volume threshold, setting the operating voltage to have a first voltage level; and
in response to the volume value greater than the first volume threshold, setting the operating voltage to have a second voltage level greater than the first voltage level.

9. The method of claim 8, wherein setting the operating voltage to have the corresponding one of the plurality of voltage levels comprises:
in response to the volume value less than or equal to a second volume threshold and greater than the first volume threshold, setting the operating voltage to have the second voltage level; and
in response to the volume value greater than the second volume threshold, setting the operating voltage to have a third voltage level greater than the second voltage level.

10. The method of claim 8, wherein the audio signal has a plurality of volume values comprising the volume value and setting the operating voltage to have the second voltage level comprises:
if the plurality of volume values comprise continuous ones greater than the first volume threshold, and a number of the continuous ones is greater than a quantity threshold, setting the operating voltage to have the second voltage level; and
if the plurality of volume values comprise continuous ones greater than the first volume threshold, and the number of the continuous ones is less than or equal to the quantity threshold, maintaining the operating voltage to have the first voltage level.

11. The method of claim 7, wherein the power amplifier is a class-D power amplifier.

12. An audio processing device, comprising:
a signal processing circuit, configured to process an audio input to generate an audio signal;
a power amplifier, comprising:
a modulator, coupled with the signal processing circuit, configured to generate a PWM signal and also configured to determine a duty cycle of the PWM signal according to the audio signal; and
a plurality of output stage circuits, coupled with the modulator and a detection circuit, configured to receive a plurality of operating voltages, respectively, and also configured to receive the PWM signal, wherein the plurality of operating voltages have respective voltage levels different from each other; and
the detection circuit, coupled with the signal processing circuit and a power switch circuit, configured to obtain a volume value from the audio signal, configured to compare the volume value with a first volume threshold to generate a comparison result, and configured to enable, according to the comparison result, a corresponding one of the plurality of output stage circuits to drive a load circuit.

13. The audio processing device of claim 12, wherein
in response to the volume value less than or equal to the first volume threshold, the detection circuit enables a first output stage circuit receiving a first operating voltage of the plurality of output stage circuits,
in response to the volume value greater than the first volume threshold, the detection circuit enables a second output stage circuit receiving a second operating voltage of the plurality of output stage circuits, wherein a voltage level of the second operating voltage is greater than a voltage level of the first operating voltage.

14. The audio processing device of claim 13, wherein
in response to the volume value less than or equal to a second volume threshold and larger than the first volume threshold, the detection circuit enables the second output stage circuit receiving the second operating voltage of the plurality of output stage circuits,
in response to the volume value greater than the second volume threshold, the detection circuit enables a third output stage circuit receiving a third operating voltage of the plurality of output stage circuits, wherein a voltage level of the third operating voltage is greater than a voltage level of the second operating voltage.

15. The audio processing device of claim 13, wherein the audio signal has a plurality of volume values comprising the volume value,
if the plurality of volume values comprise continuous ones greater than the first volume threshold, and a number of the continuous ones is greater than a quantity threshold, the detection circuit enables the second output stage circuit receiving the second operating voltage of the plurality of output stage circuits,
if the plurality of volume values comprise the continuous ones greater than the first volume threshold, and the number of the continuous ones is less than or equal to the quantity threshold, the detection circuit keeps enabling the first output stage circuit receiving the first operating voltage of the plurality of output stage circuits.

16. The audio processing device of claim 12, wherein the signal processing circuit generates the audio signal by selectively attenuating the audio input or by adjusting magnitude of one or more frequency components in the audio input.

17. The audio processing device of claim 12, wherein the power amplifier is a class-D power amplifier.

* * * * *